(12) United States Patent
Takei et al.

(10) Patent No.: US 8,361,882 B2
(45) Date of Patent: Jan. 29, 2013

(54) SEMICONDUCTOR DEVICE AND METHOD FOR MANUFACTURING SAME

(75) Inventors: Michiko Takei, Osaka (JP); Yasumori Fukushima, Osaka (JP); Kazuhide Tomiyasu, Osaka (JP); Shin Matsumoto, Osaka (JP); Kazuo Nakagawa, Osaka (JP); Yutaka Takafuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/139,988

(22) PCT Filed: Aug. 21, 2009

(86) PCT No.: PCT/JP2009/004039
§ 371 (c)(1),
(2), (4) Date: Jun. 15, 2011

(87) PCT Pub. No.: WO2010/070782
PCT Pub. Date: Jun. 24, 2010

(65) Prior Publication Data
US 2011/0241174 A1 Oct. 6, 2011

(30) Foreign Application Priority Data

Dec. 17, 2008 (JP) .................................. 2008-321165

(51) Int. Cl.
*H01L 21/30* (2006.01)
*H01L 29/06* (2006.01)

(52) U.S. Cl. ................. 438/458; 257/618; 257/E21.211; 257/E29.022

(58) Field of Classification Search .................. 438/458; 257/E21.211, E29.022
See application file for complete search history.

(56) References Cited

U.S. PATENT DOCUMENTS

| 6,455,920 B2 * | 9/2002 | Fukasawa et al. | ............ 257/620 |
| 2003/0001244 A1 * | 1/2003 | Araki et al. | .................... 257/666 |

FOREIGN PATENT DOCUMENTS

| JP | 2004-281424 A | 10/2004 |
| JP | 2008-066566 A | 3/2008 |

* cited by examiner

Primary Examiner — Lex Malsawma
(74) Attorney, Agent, or Firm — Chen Yoshimura LLP

(57) ABSTRACT

Provided is a semiconductor device manufacturing method wherein the following steps are performed; a step of forming at least a part of an element on a base body layer, a step of forming a peeling layer, a step of forming a planarizing film; a step of forming a die by separating the base body layer at a separating region; a step of bonding the die to a substrate by bonding the die on the planarizing film; and a step of peeling and removing a part of the base body layer along the peeling layer. Prior to the step of forming the die, a step of forming a groove opened on the surface of the planarizing film such that at least a part of the separating region is included on the bottom surface of the groove, and forming the die such that the die has a polygonal outer shape wherein all the internal angles are obtuse by forming the groove is performed.

18 Claims, 13 Drawing Sheets

ND METHOD# SEMICONDUCTOR DEVICE AND METHOD FOR MANUFACTURING SAME

TECHNICAL FIELD

The present invention relates to a semiconductor device, and to the method of manufacturing thereof, applied to, for example, a liquid crystal display device.

BACKGROUND ART

The inventors have discovered that it is possible to form a hydrogen implantation layer in a semiconductor substrate having semiconductor elements, such as MOS transistors formed in at least a portion thereof, and then to peel a portion of the semiconductor substrate to manufacture the semiconductor elements formed into a thin-film on another substrate. Doing so makes it possible to achieve increased performance and increased integration of the semiconductor elements. Moreover, there has been a proposal for applying, to a liquid crystal display device, a semiconductor device in which a semiconductor layer has been formed into a thin-film, through having the aforementioned other substrate be a transparent substrate. (See, for example, Patent Document 1.)

Patent Document 1 discloses the formation of grooves, having a separating region in the bottom surface thereof, prior to the formation of dies through the separation of the semiconductor substrate. Doing so makes it possible to prevent dust from incurring between the die bonding surface and the substrate surface even when dust that is produced at the time of separating the semiconductor substrate adheres to the outer edge portion of the die in which the groove is formed. The result is the ability to increase the precision of bonding of the die to the substrate.

RELATED ART DOCUMENTS

Patent Documents

Patent Document 1: Japanese Patent Application Laid-Open Publication No. 2008-66566

SUMMARY OF THE INVENTION

Problems to be Solved by the Invention

However, when the present inventors observed in detail semiconductor devices manufactured through forming rectangular dies through separating semiconductor substrates after forming grid-shaped grooves in the semiconductor substrates, and then adhering the dies onto glass substrates, they discovered that there tended to be a reduction in the dimensional accuracy at the corners of the dies adhered to the glass substrates.

FIG. 37 is a photograph showing a corner portion of a die 100 that is adhered to a glass substrate. FIG. 38 is a photograph showing a further enlarged view of the corner portion of the die 100 in FIG. 37. As illustrated in FIG. 37, even a corner of a die 100 that appears to have excellent precision at first glance, upon detailed observation, is shown to be worn to an uneven shape, as illustrated in FIG. 38.

When the corners of the die are worn to an uneven shape and if there are gaps between the die and the surface of the substrate at these corners, there will be a risk of some of the dies peeling at the corners in cleaning processes and the like, which can produce particulates. Additionally, this makes it difficult to cover the corners of the die with an interlayer insulating layer with high accuracy, so there is a risk of open circuits in the interconnections and the like formed on the interlayer insulating layer.

The present invention is a result of consideration of these various points, and the primary object thereof is to increase as much as possible the dimensional accuracy of the bonded die while increasing the alignment accuracy between the die and the substrate.

Means for Solving the Problem

In the present invention, the following means are provided in order to achieve the aforementioned object.

A method for manufacturing a semiconductor device according to the present invention includes: forming at least a portion of an element in a base body layer; forming a peeling layer through ion implantation of a substance for peeling into the base body layer; forming a planarizing film having a planar surface so as to cover the at least the portion of the element; separating the base body layer in which the peeling layer has been formed in the direction of thickness of the base body layer in a prescribed separating region to form a die having the at least the portion of the element; bonding the die onto a substrate at a surface of the planarizing film; peeling and removing the portion of the base body layer in the die that has been bonded to the substrate along the peeling layer; and prior to the formation of the die, forming a groove, open to the surface of the planarizing film, so as to include at least a portion of the separating region in the bottom surface of the groove, wherein in the step of forming the groove, the external shape of the die, when viewed from the direction of thickness of the base body layer, is shaped as a polygon in which all internal angles are obtuse.

A method for manufacturing a semiconductor device according to the present invention includes: forming at least a portion of an element in a base body layer; forming a peeling layer through ion implantation of a substance for peeling into the base body layer; forming a planarizing film having a planar surface so as to cover the at least the portion of the element; separating the base body layer in which the peeling layer has been formed in the direction of thickness of the base body layer in a prescribed separating region to form a die having the at least the portion of the element; bonding the die onto a substrate at a surface of the planarizing film; peeling and removing a portion of the base body layer in the die that has been bonded to the substrate along the peeling layer; and prior to the formation of the die, forming a groove, open to the surface of the planarizing film, so as to include at least a portion of the separating region in the bottom surface of the groove, wherein, in the step of forming the groove, arc-shaped portions are formed at the exterior shape of the die so that no interior angles are formed, when viewed from the direction of thickness of the base body layer.

The groove may have a bottom surface that is further on the opposite side of the planarizing film than the peeling layer.

The substrate may be a glass substrate.

The base body layer may be one of the following: a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a $LiNbO_3$ layer, a $LaAlO_3$ layer, or a $SrTiO_3$ layer.

The substance for peeling may be at least one of hydrogen and an inactive element.

Additionally, a semiconductor device according to the present invention is a semiconductor device provided with a die in which at least a portion of an element is covered with a planarizing film, and a substrate in which the die is bonded with the planarizing film interposed therebetween, wherein the exterior shape of the die, when viewed from the direction of thickness of the substrate, forms a polygon in which all the interior angles are obtuse.

Additionally, a semiconductor device according to the present invention is a semiconductor device provided with a die in which at least a portion of an element is covered with a planarizing film, and a substrate to which the die is bonded with the planarizing film interposed therebetween, wherein arc-shaped portions are formed at the exterior shape of the die so that no interior angles are formed, when viewed from the direction of thickness of the base body layer.

The outside surface of the die may be formed so as to be a planar shape through photolithography and etching.

The substrate may be a glass substrate.

—Operation—

The operation of the present invention will be explained next.

When manufacturing a semiconductor device, first at least a portion of an element is formed in a base body layer. One of the following may be used as the base body layer: a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a $LiNbO_3$ layer, a $LaAlO_3$ layer, or a $SrTiO_3$ layer.

Following this, transistors or other elements that are subject to transfer are formed through specific steps in the base body layer, and a substance for peeling is implanted by ion implantation to form a peeling layer. The substance for peeling may use, for example, at least one of hydrogen and an inactive element. Moreover, a planarizing film having a planar surface is formed so as to cover the at least the portion of the element.

Following this, grooves that are open to the surface of the planarizing film are formed so as to include, in the bottom surface of the grooves, at least a portion of the separating region used when the dies are formed in a subsequent step. Preferably the grooves have a bottom surface that is further on the opposite side of the planarizing film than the peeling layer.

At this time, the exterior shape of the die is formed, through the formation of the grooves, into a polygon in which all interior angles are obtuse, when viewed from the direction of thickness of the base body layer. Alternatively, the exterior shape of the die may be formed, through the formation of the grooves, to form arc-shaped portions so as to form no interior angles, when viewed from the direction of thickness of the base body layer.

Following this, a die having at least a portion of the element is formed through separating, in a prescribed separating region, the base body layer in the direction of thickness thereof. That is, on at least a portion of the side surface of the die, the inner surface of one side of the groove and a portion of the bottom surface of the groove that is continuous therewith will remain in a cutout shape.

Following this, the die is bonded to a substrate, such as a glass substrate, at the surface of the planarization film. When this is done, in the state in which the die is bonded to the substrate, a gap will be formed between the substrate and the bottom surface of the cutout shape portion of the die. Consequently, even if dust is adhered to the cutout shape portion of the die, it is possible to prevent, through this gap, the dust from becoming pinched between the die and the substrate. The result is that there will be excellent bonding between the die and the substrate.

After this, a portion of the base body layer in the die that has been bonded to the substrate is peeled and removed along the peeling layer. Doing so makes it possible to form the base body layer into a thin-film, to increase the speed of operation of the element, and to reduce parasitic capacitance.

Additionally, if the groove is formed by photolithography and etching, for example, it is possible to form the inside surfaces of the groove so as to be smooth and flat. Doing so causes at least a portion of the side surface of the die to be smooth, so as not to become a rough side surface, as in the breaking surface through normal dicing, thus making it possible to increase the positional precision of the bonding of the die to the substrate. This also eliminates the need for a large bonding machine.

Here, if the interior angle formed in the exterior shape of the die D, when viewed from the direction of thickness of the substrate, were less than 90°, then, as illustrated in FIG. 31, the bonding strength between the die D and the substrate at the corner portion point A would be relatively small. It is understood that this is because the area from which the bonding force can be received around the point A is small in the case in FIG. 31, in which the angle at the point A is 90°, as compared to cases where the area from which the bonding force can be obtained around the point A is large, such as the case in FIG. 30 in which the angle at point A is 180°, or the case in FIG. 29 in which the angle at the point A is 360°.

Given this, in the present invention, as described above, the exterior shape of the die is formed into a polygon in which all interior angles are obtuse, or arc-shaped portions in which no interior angles are formed in the exterior shape of the die, so that the interior angles will not be less than 90°, and thus, as a result of obtaining adequate bonding forces between the die and the substrate around the entire periphery of the die, the dimensional accuracy of the die that is bonded to the substrate can be improved substantially.

Effects of the Invention

In the present invention, a groove that includes at least a portion of the separating area at the bottom surface thereof is formed prior to forming the die, and the exterior shape of the die is formed, through the formation of the grooves, into a polygon shape in which all of the interior angles are obtuse, or arc-shaped portions are formed so that no interior angles are formed in the exterior shape of the die. Thus, not only is it possible to increase the accuracy of bonding of the die to the substrate by not pinching dust between the die and the substrate, but also possible to greatly increase the dimensional accuracy of the bonded die, as a result of obtaining adequate bonding strength between the die and the substrate throughout the entire periphery of the die.

DETAILED DESCRIPTION OF THE EMBODIMENTS

Embodiments of the present invention will be explained in detail below based on the drawings. Note that the present invention is not limited to the embodiments set forth below.

Embodiment 1

FIG. 1 through FIG. 28 illustrate an embodiment of the present invention.

Figure 1:
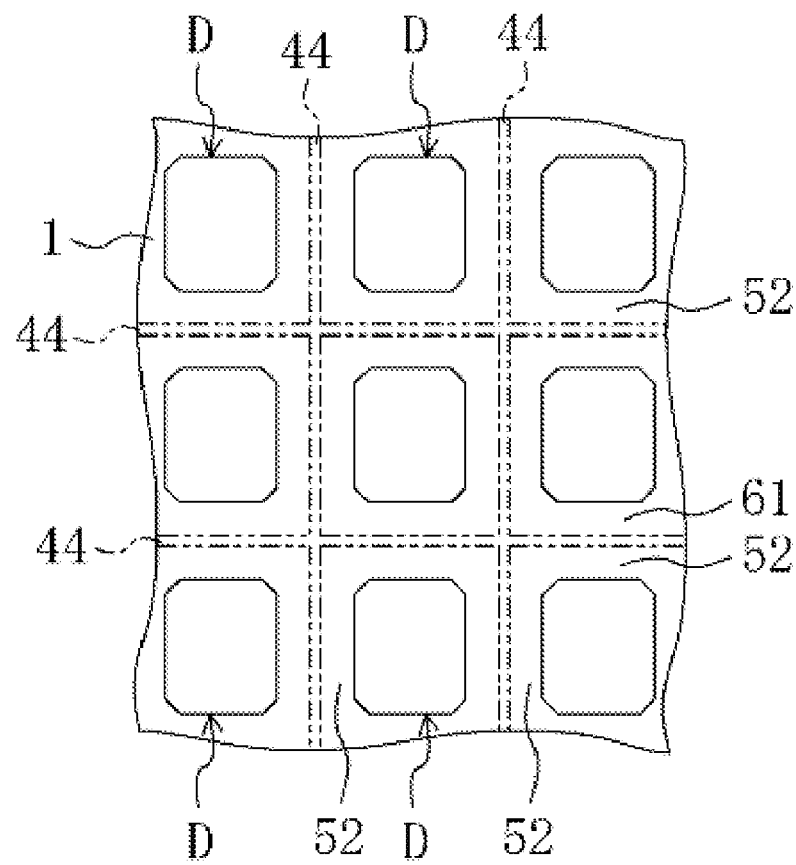
FIG. 1 is a plan view showing an enlargement of a portion of a silicon substrate in which grooves are formed.
Figure 2:
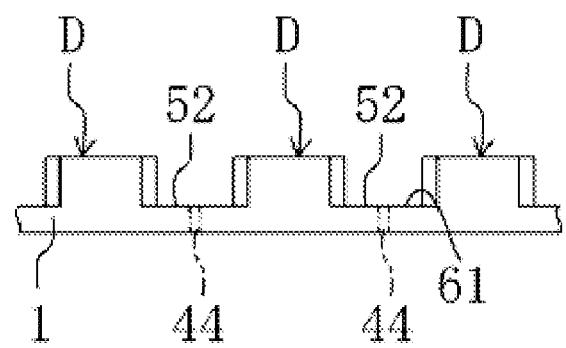
FIG. 2 is a cross-sectional diagram showing an enlargement of a portion of a silicon substrate in which grooves are formed.
Figure 3:
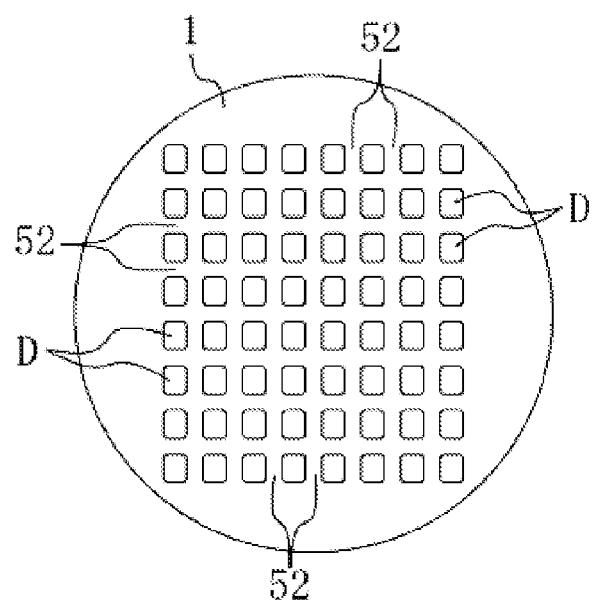
FIG. 3 is a plan view showing schematically the entirety of a silicon substrate that is a wafer.
Figure 4:
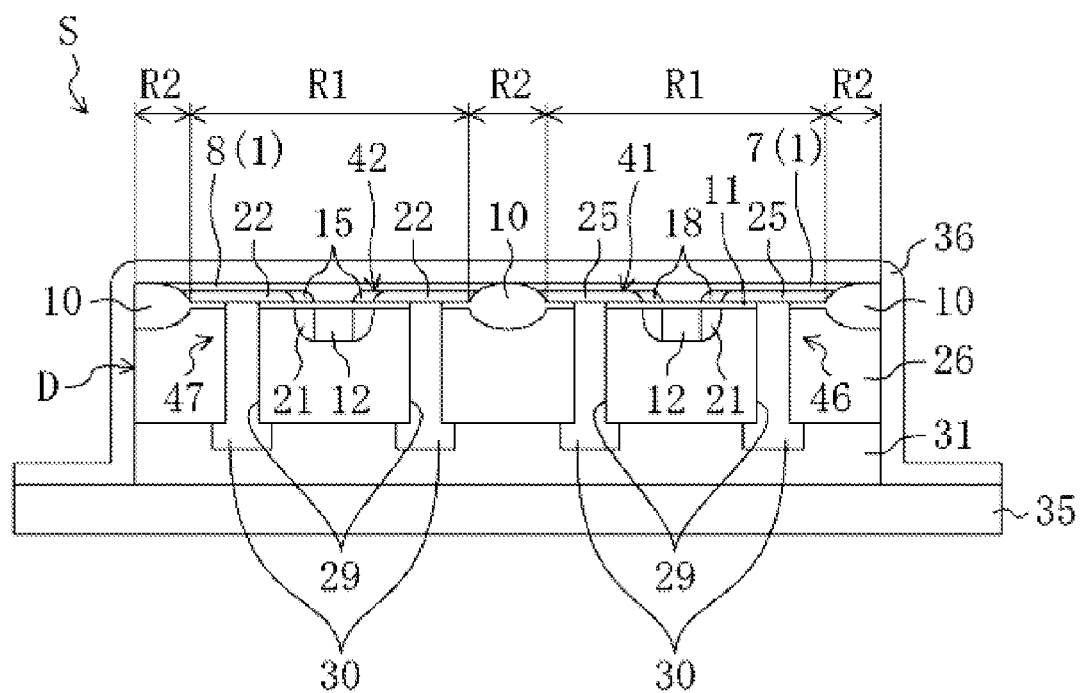
FIG. 4 is a cross-sectional diagram showing the structure of a semiconductor device according to an embodiment of the present invention.

FIG. 1 is a plan view showing an enlargement of a portion of a silicon substrate in which grooves are formed. FIG. 2 is a cross-sectional diagram showing an enlargement of a portion of a silicon substrate in which grooves are formed. FIG. 3 is a plan view showing schematically the entirety of a silicon substrate that is a wafer. FIG. 4 is a cross-sectional diagram showing the structure of a semiconductor device S. FIG. 5 through FIG. 25 are cross-sectional diagrams showing the individual steps in manufacturing the semiconductor device S.

Figure 28:
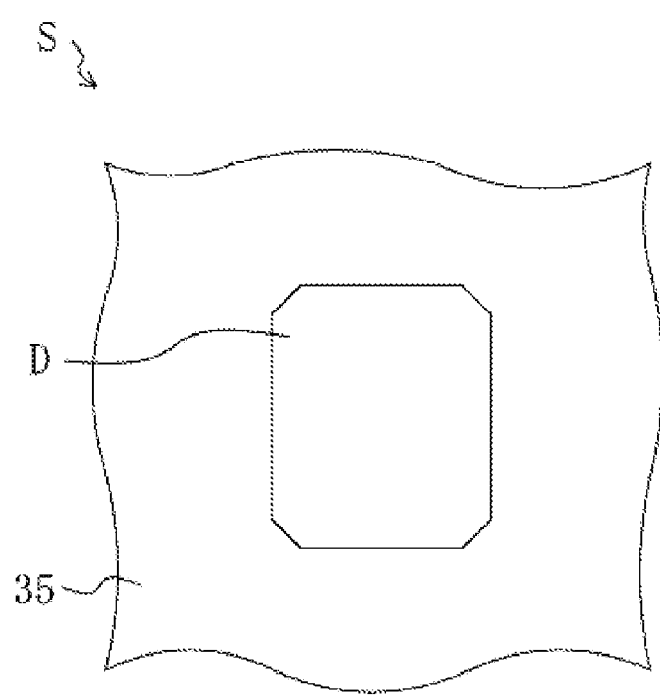
FIG. 28 is a plan view showing schematically the external appearance of the semiconductor device.
Figure 29:
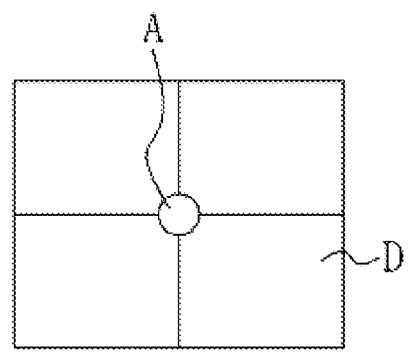
FIG. 29 is a plan view showing a portion in which the die has been formed at 360° around the point A.
Figure 30:
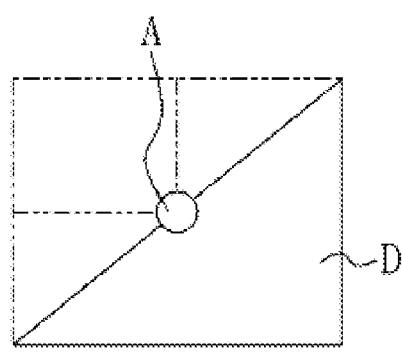
FIG. 30 is a plan view showing a portion in which the die has been formed at 180° around the point A.
Figure 31:
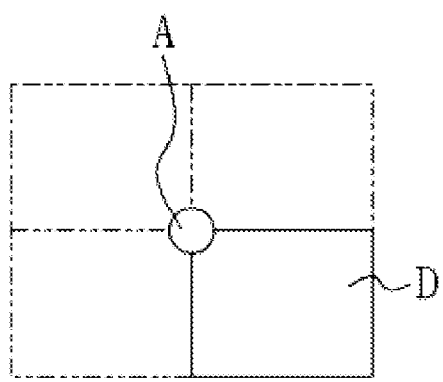
FIG. 31 is a plan view showing a portion in which the die has been formed at 90° around the point A.

FIG. 28 is a plan view illustrating schematically the external appearance of the semiconductor device S.

—Structure of the Semiconductor Device—

The semiconductor device S is structured as a device that includes MOS transistors 46 and 47, formed on a glass substrate 35. Here the semiconductor device is a concept that includes a semiconductor element. Additionally, a substrate having an insulating layer on a surface, whereon the MOS transistors 46 and 47 are formed, can be used instead of the glass substrate 35.

The semiconductor device S, although omitted from the drawings, constitutes, for example, a liquid crystal display device display panel. The liquid crystal display device, although omitted from the figures, includes a TFT substrate on which TFTs are formed as a plurality of switching elements, an opposite substrate disposed facing the TFT substrate, and a liquid crystal layer disposed between the TFT substrate and the opposite substrate. A plurality of pixels is provided on the TFT substrate, where a TFT and a pixel electrode are provided for each individual pixel. Additionally, a driver for driving a plurality of pixels is formed in a non-display region. The semiconductor device S in the present embodiment constitutes this driver.

(Die Structure)

The semiconductor device S, as illustrated in FIG. 4, is provided with a glass substrate 35 and a die D that is formed with high density and high precision on the glass substrate 35. Transistors 46 and 47, which are elements, are included in the die D, where the MOS transistors 46 and 47 are covered by planarizing films 26 and 31. Additionally, the die D is bonded, through self-bonding, onto the glass substrate 35 through the planarizing film 31. Additionally, the outside surface of the die D is formed into a planar shape through photolithography and etching.

Note that while in the case of application of the semiconductor device S to a liquid crystal display device that performs a transparent display, the substrate 1 preferably is a transparent substrate such as a glass substrate 35, when applied to other types of display devices, the substrate 35 may use another substrate, such as a silicon substrate.

Additionally, the exterior shape of the die D in the present embodiment has a shape in which the four edges are C-chamfered so as to be parallel to each other in a rectangular solid, so that when viewed from the direction of thickness of the glass substrate 35 (that is, from the direction of the line that is normal to the surface of the glass substrate 35), it will be formed into an octagon in which the corners of the rectangle are chamfered. Through this, in the exterior shape of the die D, all of the interior angles, when viewed from the direction of thickness of the glass substrate 35, will be obtuse. Note that insofar as the interior angles are obtuse, the exterior shape of the die D, described above, may be that of a polygon other than an octagon.

The die D has a plurality of first regions R1 (where only two first regions R1 are illustrated in FIG. 4), formed from the active regions 41 and 42, and second regions R2 that are disposed between each of the first regions R1. NMOS transistors 47 and PMOS transistors 46, which are semiconductor elements, are formed in the first regions R1. Element isolating regions, which isolate electrically between the individual transistors 46 and 47, are formed in the second regions R2, where a LOCOS oxide film 10, which is an element isolating film, is formed in the element isolating region.

Note that while only a single NMOS transistor 47 and a single PMOS transistor 46 are illustrated here, the device that is formed is not limited thereto, but rather this can apply to all different types of semiconductor devices. Additionally, the number of the elements is not limited, and can be one to several million. Moreover, at least a portion of an element may be formed in the die D.

(Structure of MOS Transistors)

The active regions 41 and 42 are formed in the base body layer 1, and include a first active region 41, for structuring the PMOS transistor 46, provided in the first region R1 at the right side in FIG. 4, and a second active region 42 for structuring the NMOS transistor 47, provided in the first region R1 on the left side in FIG. 4. The first active region 41 includes an n-type impurity element, such as phosphorus, and a p-type impurity element, such as boron. On the other hand, the second active region 42 includes a p-type impurity element such as boron.

Each of the active regions 41 and 42 have lightly doped drain (LDD) structures that are formed from low concentration impurity regions 15 and 18 that are formed on both the left and right outsides of channel regions 7 and 8, and high concentration impurity regions 22 and 25 that are formed to the outsides of the low concentration impurity regions 15 and 18. That is, not only is an n-well region 7 for forming the channel region 7 formed in the first active region 41, but also p-type low concentration impurity regions 18, disposed on both the left and the right sides of the channel region 7, as well as p-type high concentration impurity regions 25, disposed on both of the outsides of the p-type low concentration impurity regions 18 are formed in the first active region 41 as well. On the other hand, not only is a p-well region 8 for forming the channel region 8 formed in the second active region 42, but also n-type low concentration impurity regions 15, disposed on both the left and the right sides of the channel region 8, as well as n-type high concentration impurity regions 22, disposed on both of the outsides of the n-type low concentration impurity regions 15 are formed in the second active region 42 as well.

The base body layer 1 is a semiconductor layer such as a single crystal silicon layer. Note that the base body layer 1 can use one of the following: a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a $LiNbO_3$ layer, a $LaAlO_3$ layer, or a $SrTiO_3$ layer.

As will be described below, a portion of the base body layer 1 is peeled along a peeling layer that is formed through ion implantation of a substance for peeling, such as hydrogen. Note that at least hydrogen or an inactive element (that is, helium, neon, argon, krypton, or the like) can be used as the substance for peeling. The base body layer 1 is formed into a thin-film through the peeling removal of a portion thereof.

As illustrated in FIG. 4, the planarizing film 31, which is an insulating layer, is layered onto the surface of the glass substrate 35. A planarizing film 26 is further layered onto this planarizing film 31. A gate oxide film 11 is formed in the first region R1, and a LOCOS oxide film 10 is formed in the second region R2, on the planarizing film 26. The active regions 41 and 42 are formed on the gate oxide film 11. These active regions are covered by the LOCOS oxide film 10 and the protecting film 36 for passivating the surface thereof.

Additionally, in the first region R1, a gate electrode 12 made of polysilicon, for example, and a sidewall 21 are formed between the planarizing film 26 and the gate oxide film 11. The surface of the planarizing film 26 in the first region R1 is formed in a recessed shape locally, where the gate electrode 12 and the sidewall 21 are disposed within the recessed portion. The gate electrodes 12 face the channel regions 7 and 8 with the gate oxide film 11 interposed therebetween. On the other hand, the sidewalls 21 are disposed on the sides of the gate electrode 12, and face the low concentration impurity regions 15 and 18 with the gate oxide film 11 interposed therebetween.

Contact holes 29 are formed to penetrate through the planarizing films 26 and 31 at the positions of the overlap with the high impurity regions 22 and 25. A source electrode 30 and a drain electrode 30, which are metal electrodes, are formed in the contact holes 29.

—Manufacturing Method—

The method for manufacturing the aforementioned semiconductor device S will be explained next.

(Step for Forming the Elements)

Figure 5:
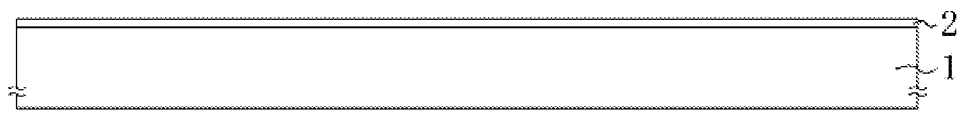
FIG. 5 is a cross-sectional diagram showing a thermal oxide film formed on the silicon substrate.

First, in the step for forming the elements, at least a portion of the NMOS transistor 47 and the PMOS transistor 46, which are elements, are formed in the base body layer 1. That is, as illustrated in FIG. 5, a thermal oxide film 2 about 30 nm thick is formed on a silicon substrate 1 (corresponding to the base body layer 1) that is a wafer. The thermal oxide film 2 is for the purpose of protecting against contamination of the surface of the silicon substrate 1 in a subsequent step in which ion implantation is performed, but is not absolutely necessary.

Figure 6:
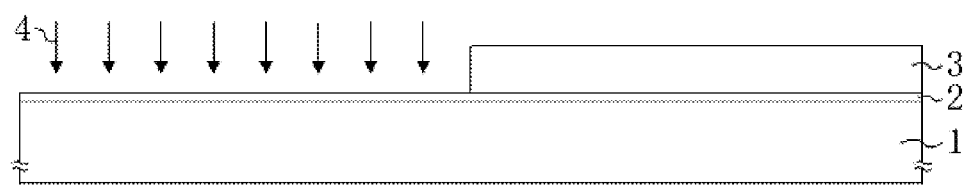
FIG. 6 is a cross-sectional diagram showing the step for ion implantation of an n-type impurity element into a first region.

Following this, as illustrated in FIG. 6, ion implantation of an n-type impurity element 4 (for example, phosphorus or the like) into the region that will become the first active region 41 is performed in a state in which a resist mask 3 has been formed on the region that will become the second active region 42, as illustrated in FIG. 6. When performing ion implantation of the phosphorus element, the implantation energy is set to about 50 to about 150 KeV, and the dose is about $1 \times 10^{12}$ to about $1 \times 10^{13}$ $cm^{-2}$. At this time, the implantation dose for the n-type impurity element is set in consideration of the amount that will be canceled out by the p-type impurity element if a p-type impurity element is to be implanted into the entire surface of the silicon substrate 1 in the next step.

Figure 7:
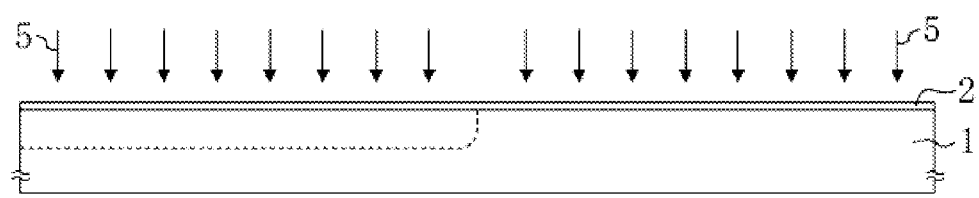
FIG. 7 is a cross-sectional diagram showing a step for ion implantation of a p-type impurity element into first and second regions.

Following this, after the resist 3 is removed, ion implantation of a p-type impurity element 5 (for example, boron or the like) is implanted simultaneously into both the region that will become the first active region 41 and the region that will become the second active region 42, as illustrated in FIG. 7. When performing ion implantation of boron, the implantation energy is set to about 10 and about 50 KeV and the dose is about $1\times10^{12}$ to about $1\times10^{13}$ cm$^{-2}$.

Figure 8:
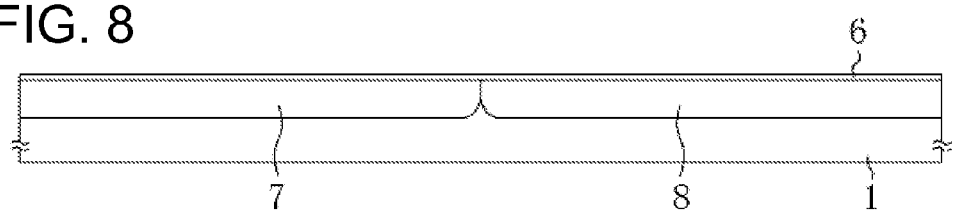
FIG. 8 is a cross-sectional diagram showing a thermal oxide film formed in an n-well region and a p-well region.

Following this, after the thermal oxide film 2 is removed, a heat treatment is performed at about 900 to about 1,000° in an oxidizing atmosphere to form a thermal oxide film 6 approximately 30 nm thick, and to diffuse the impurity elements that have been implanted into the n-well region 7 and the p-well region 8, to form the n-well region 7 and the p-well region 8, as illustrated in FIG. 8.

Figure 9:
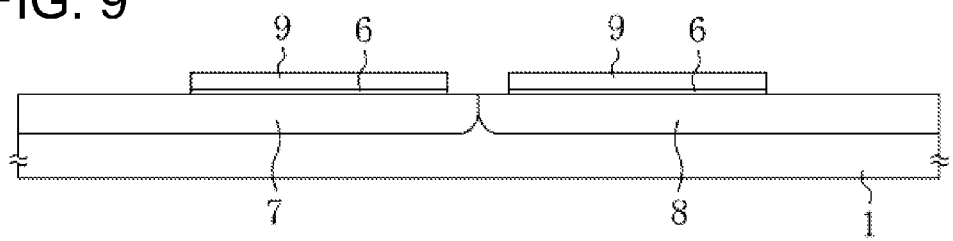
FIG. 9 is a cross-sectional diagram showing a patterned thermal oxide film and silicon nitride film.

Following this, after a silicon nitride film 9 with a thickness of about 200 nm has been formed by CVD or the like, on the surface of the silicon substrate 1 (the n-well region 7 and the p-well region 8), as illustrated in FIG. 9, patterning of the silicon nitride film 9 and the thermal oxide film 6 is performed.

At this time, portions of the n-well region 7 and the p-well region 8 are covered by the silicon nitride film 9 and the thermal oxide film 6. In addition, a region that includes the boundary between the n-well region 7 and the p-well region 8 is exposed. Furthermore, while the regions on which the silicon nitride film 9 and the thermal oxide film 6 remain will later become the first region R1, the other regions, in which the silicon nitride film 9 and the thermal oxide film 6 have been removed, will later become the second region R2.

Figure 10:
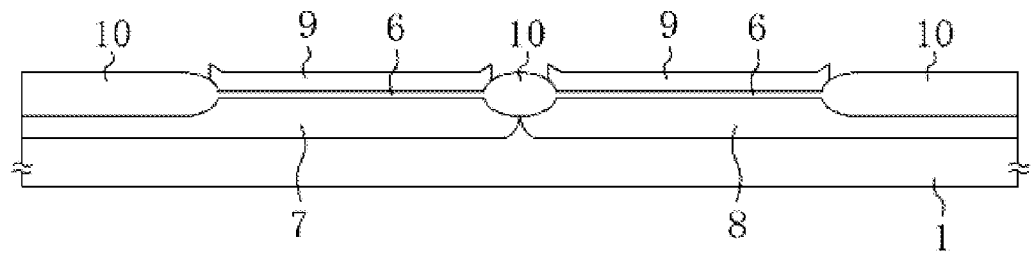
FIG. 10 is a cross-sectional diagram illustrating a LOCOS oxide film formed in the second region.

Following this, LOCOS oxidation is performed through a heat treatment at about 900 to about 1,000° in an oxygen atmosphere, as illustrated in FIG. 10. Doing this forms a LOCOS oxide film 10 that is between about 200 and about 500 nm thick, for example, 350 nm. The LOCOS oxide film 10 is formed in the regions that are exposed from the silicon nitride film 9 and the silicon oxide film 6. In this way, a plurality of regions in which the LOCOS oxide film 10 is formed each becomes a second region R2. Additionally, the regions between these second regions R2 become the first regions R1 in which the active regions 41 and 42 will be formed in subsequent steps. Note that the LOCOS oxide is a method for isolating elements, and the element isolation may be performed through methods other than LOCOS oxide, such as shallow trench isolation (STI), for example.

Figure 11:
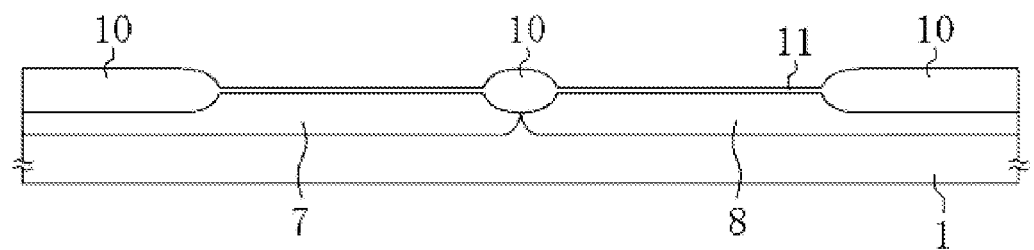
FIG. 11 is a cross-sectional diagram illustrating a gate oxide film formed in the first region.

Following this, after first removing the silicon nitride film 9 and the thermal oxide film 6, a heat treatment is performed at about 1000° C. in an oxygen atmosphere to form a gate oxide film 11 with a thickness of about 10 to about 20 nm on the surface of the n-well region 7 and the p-well region 8 in the first region R1, as illustrated in FIG. 11. Note that ion implantation of n-type impurity ions and p-type impurity ions into the NMOS and PMOS transistors, respectively, may be performed after the removal of the silicon nitride film 9 in order to adjust the threshold voltages of the NMOS and PMOS transistors.

Figure 12:
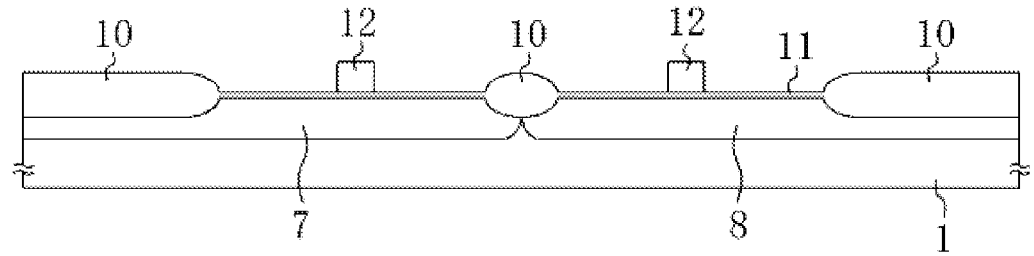
FIG. 12 is a cross-sectional diagram showing a gate electrode formed in the first region.

Thereafter, the NMOS transistor and PMOS transistor gate electrodes 12 are formed on top of the gate oxide film 11 in the first regions R1, as illustrated in FIG. 12. The gate electrodes 12 are formed through patterning using photolithography after depositing polysilicon with a thickness of about 300 nm by CVD or the like onto the gate oxide film 11.

Figure 13:
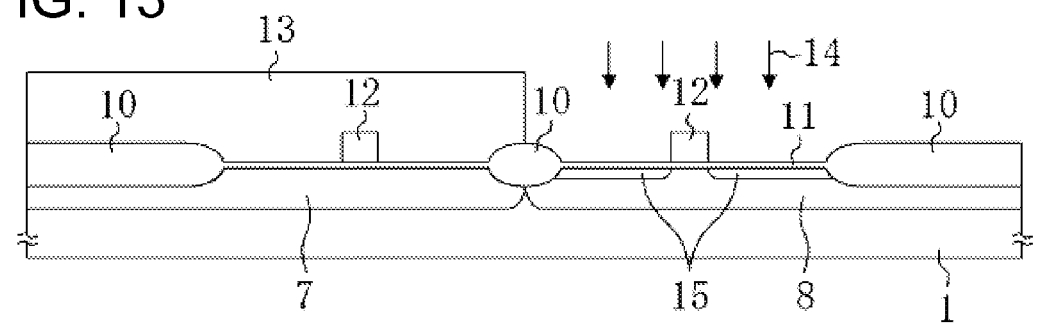
FIG. 13 is a cross-sectional diagram showing a step for forming a low concentration impurity region in the second region.

Following this, a resist 13 is formed with an opening in the region in which the NMOS transistor is to be formed (the region on the right-hand side in FIG. 13), and the gate electrode 12 is used as a mask to perform ion implantation of an n-type impurity element 14, as illustrated in FIG. 13. This forms an n-type low concentration impurity region 15 in the silicon substrate 1. Elemental phosphorus, for example, can be used as the n-type impurity element 14, with a dose of about $5\times10^{12}$ to about $5\times10^{13}$ cm$^{-2}$ as the ion implantation condition, for example.

Figure 14:
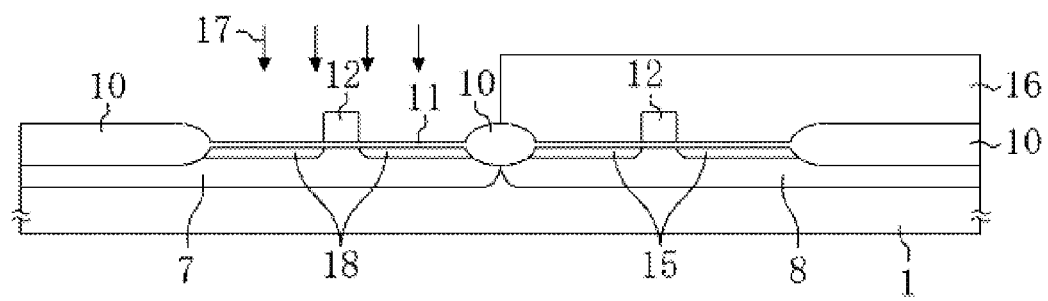
FIG. 14 is a cross-sectional diagram showing a step for forming a low concentration impurity region in the first region.

Following this, a resist 16 is formed with an opening in the region in which the PMOS transistor is to be formed (the region on the left-hand side in FIG. 14), and the gate electrode 12 is used as a mask to perform ion implantation of a p-type impurity element 17, as illustrated in FIG. 14. This forms a p-type low concentration impurity region 18. Elemental boron, for example, can be used as the p-type impurity element 17, with, for example, a dose of about $5\times10^{12}$ to about $5\times10^{13}$ cm$^{-2}$ as the ion implantation condition.

Note that because the coefficient of thermal diffusion for boron is relatively large, it may be possible to form the p-type low concentration impurity region for the PMOS transistor, in a subsequent process, by thermal diffusion of only the boron that has been implanted when forming the p-type high concentration impurity region for the PMOS transistor. Consequently, the ion implantation to form the p-type low concentration impurity region 18 need not necessarily be performed.

Figure 15:
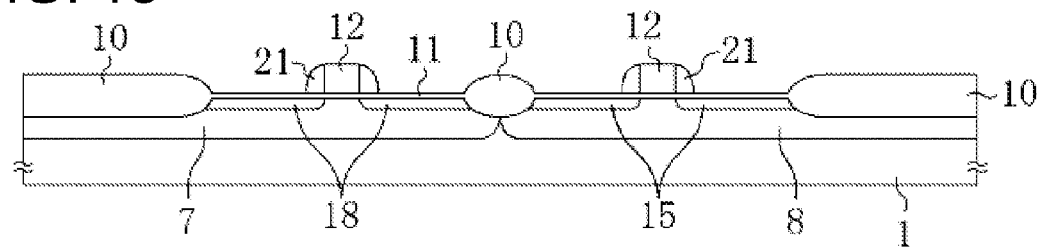
FIG. 15 is a cross-sectional diagram showing a state in which side walls have been formed.

Following this, a SiO$_2$ film is formed by CVD or the like so as to cover the gate oxide film 11 and the LOCOS oxide film 10, and the like. Thereafter the sidewalls 21, made from SiO$_2$, are formed on both side walls of the gate electrodes 12, as illustrated in FIG. 15, through performing anisotropic etching of this SiO$_2$ film.

Figure 16:
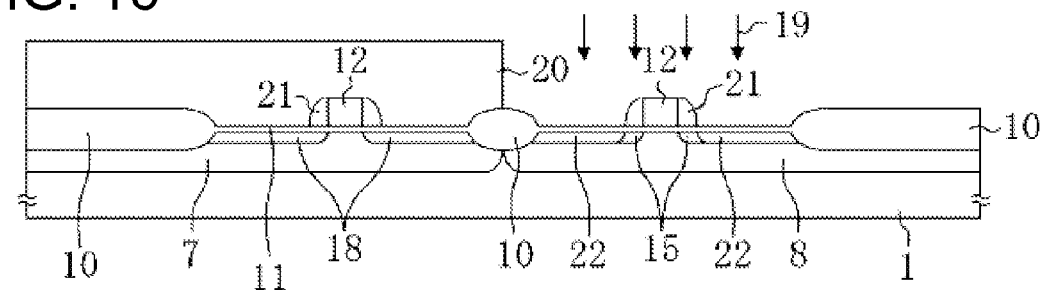
FIG. 16 is a cross-sectional diagram showing a step for forming a high concentration impurity region in the second region.

Following this, a resist 20 is formed with an opening in the region in which the NMOS transistor will be formed, and ion implantation of an n-type impurity element 19, such as phosphorus, into the silicon substrate 1 is performed using the gate electrode 12 and the sidewalls 21 as a mask, as illustrated in FIG. 16. Doing so forms the n-type high concentration impurity regions 22 on the outsides on both sides of the n-type low concentration impurity regions 15.

Figure 17:
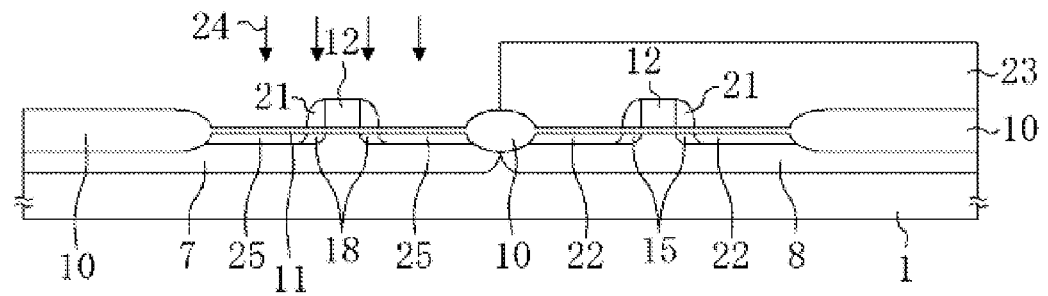
FIG. 17 is a cross-sectional diagram showing a step for forming a high concentration impurity region in the first region.

Following this, a resist 23 is formed with an opening in the region in which the PMOS transistor will be formed, and ion implantation of a p-type impurity element 24, such as boron, into the silicon substrate 1 is performed using the gate electrode 12 and the sidewalls 21 as a mask, as illustrated in FIG. 17. Doing so forms the p-type high concentration impurity regions 25 on the outsides on both sides of the p-type low concentration impurity region 18. Thereafter, a heat treatment is performed on the regions in which impurity elements have been implanted through ion implantation, to activate those impurity elements. The heat treatment is performed for 10 min at 900° C., for example.

Figure 18:
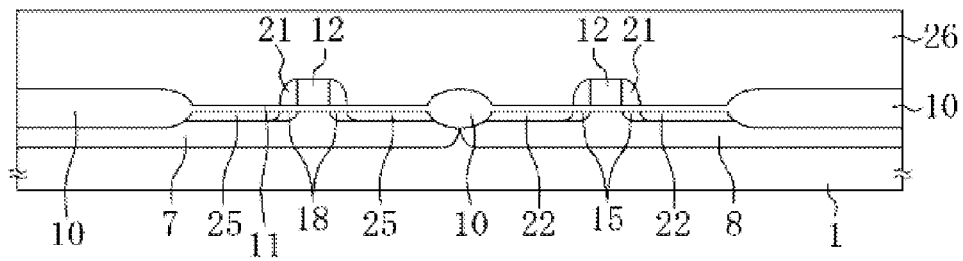
FIG. 18 is a cross-sectional diagram showing a state in which a planarizing film has been formed.

Thereafter, as illustrated in FIG. 18, a planarizing film 26 that is about 600 nm thick, planarized by CMP or the like, is formed after forming an insulating film of SiO$_2$ or the like, so as to cover the gate electrode 12 and the sidewalls 21, and the like. Doing so causes the thickness of the insulating film in the second region R2 to be about 950 nm (=600 nm+350 nm).

(Step for Forming the Peeling Layer)

Figure 19:
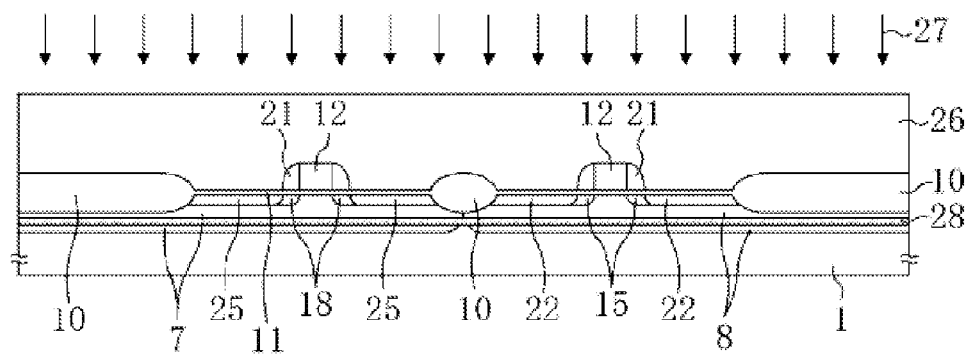
FIG. 19 is a cross-sectional diagram showing a state in which a peeling layer has been formed.

A step for forming the peeling layer is performed next. In the peeling layer forming step, as illustrated in FIG. 19, ion implantation of a substance 27 for peeling is implanted, through ion implantation, into the silicon substrate 1 through the planarizing film 26 to form a peeling layer 28. The substance 27 for peeling may include at least one of hydrogen and one or more inactive elements such as helium, neon, and the like. When the substance 27 for peeling is hydrogen, for example, the ion implantation conditions are a dose of $2\times10^{16}$ to $1\times10^{17}$ cm$^{-2}$ and an implantation energy of about 100 to about 200 KeV. When hydrogen is implanted at 150 KeV, for example, the peak of the hydrogen concentration will be formed at a depth of about 1400 nm from the surface of the planarizing film 26.

Figure 20:
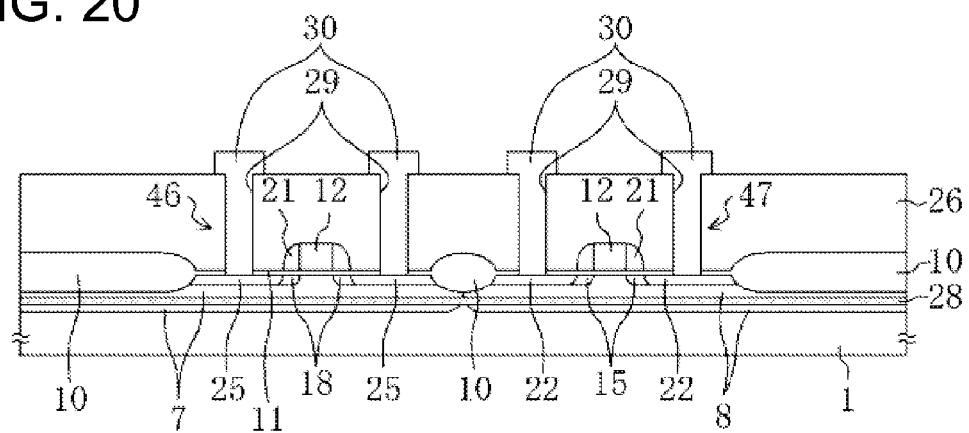
FIG. 20 is a cross-sectional diagram showing a state in which contact holes and electrodes have been formed.

Following this, contact holes 29 are formed in the planarizing film 26, to expose the high concentration impurity regions 22 and 25 at the bottom of the contact holes 29. Thereafter, a metal material is filled into the contact holes 29 to form metal electrodes 30, as illustrated in FIG. 20. Note that if the film thickness of the planarizing film 26 should be increased as an interlayer insulating layer in order to reduce the capacitance of the metal interconnection layers, for example, an insulating film of SiO$_2$ or the like may be formed additionally by CVD or the like, prior to forming the contact holes 29. The element forming step is performed as described above.

(Step for Forming the Planarizing Film)

Figure 21:
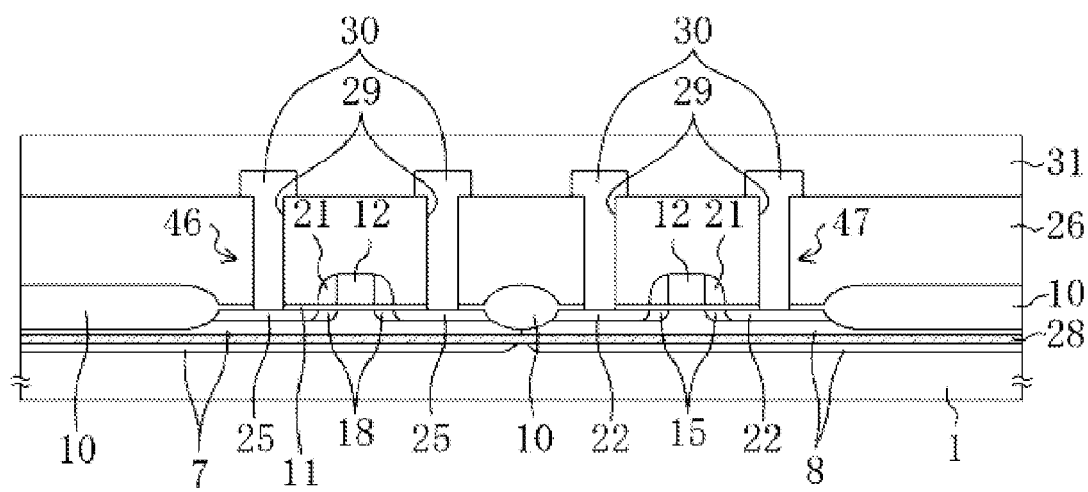
FIG. 21 is a cross-sectional diagram showing a state in which a planarizing film has been formed to cover the electrodes.
Figure 22:
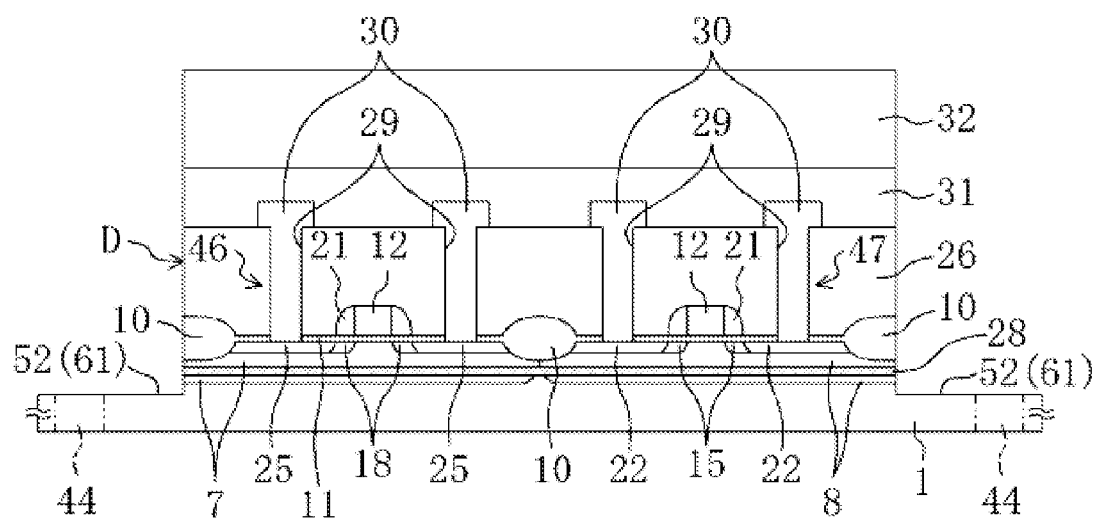
FIG. 22 is a cross-sectional diagram showing a state in which grooves have been formed.

The step for forming the planarizing film is performed next. In the planarizing film forming step, a planarizing film 31 having a planar surface is formed on the silicon substrate 1 (corresponding to the base body layer 1, below) so as to cover at least a portion of the aforementioned NMOS transistor 47 and PMOS transistor 46, which are the elements. That is, first an insulating film is deposited to a thickness of about 2 μm by CVD or the like onto the planarizing film 26 of the first regions R1 and the second regions R2. Thereafter, the surface is planarized through polishing the insulating layer to a thickness of about 1 μm using a CMP method or the like to form the planarizing film 31 as illustrated in FIG. 21.

(Step for Forming the Grooves)

Following this, the step for forming the grooves is performed. In the groove forming step, grooves 52 that are open to the surface of the planarizing film 31 are formed in the shape of a grid as illustrated in FIG. 1 through FIG. 3 and FIG. 22. Note that the grooves 52 are not necessarily limited to being formed in the shape of a grid. To do this, first, a photoresist 32 is formed that is opened in a region including a separating region 44 for separating through dicing in a subsequent step. The separating region 44 is a grid-shaped region that is formed surrounding the regions in which the dies D will be formed, as illustrated in FIG. 1. The opening of the photoresist 32 is formed so as to be wider than the separating region 44, and forms a grid shape along the separating region 44. Furthermore, the openings of the photoresist 32 are formed so as to chamfer the corners of the die D at the regions of the intersections in the grid.

Additionally, the planarizing films 26 and 31, the LOCOS oxide film 10, the base body layer 1, and the peeling layer 28 are removed through dry etching in the regions exposed in the grid shape from the photoresist 32 to form grooves 52 to positions that are deeper than the peeling layer 28, as illustrated in FIG. 1 to FIG. 3 and FIG. 22. For example, because in the present embodiment, the depth from the surface of the substrate to the peeling layer 28 is about 2.4 μm, the grooves 52 are formed to a depth of about 3 to about 3.5 μm by dry etching. Note that the grooves 52 may be formed by wet etching instead.

In this way, the grooves 52 have bottom surfaces 61 that are further on the opposite side of the planarizing film 31 than the peeling layer 28, and are formed so as to include at least a portion of the separating region 44 in the bottom surfaces 61. Additionally, the grooves 52, as illustrated in FIG. 1 and FIG. 2, are structured from grid-shaped grooves that extend along the separating region 44 with a width that is greater than that of the separating region 44 in accordance with the shape of the opening in the photoresist 32. The separating regions 44 are formed essentially in the centers of the bottom surfaces 61 of the grid-shaped grooves 52, and extend along the grooves 52. Additionally, the exterior shape of the die D is formed into an octagon, as a polygon in which all interior angles are obtuse, when viewed from the direction of thickness of the base body layer 1, through the formation of these grooves 52.

(Step for Forming the Die)

Figure 23:
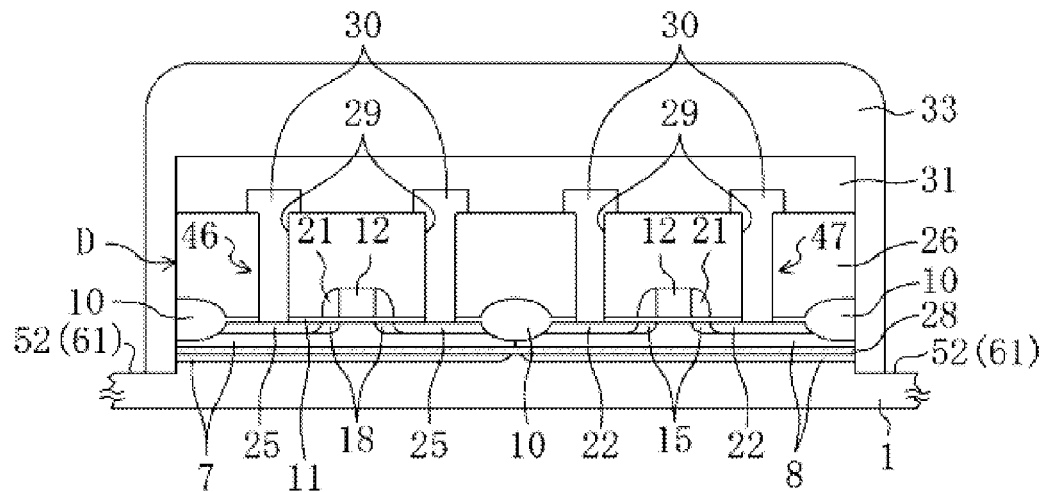
FIG. 23 is a cross-sectional diagram showing a die that has been diced in a state in which a protective layer has been formed.

The step for forming the die is performed next. In the die forming step, the base body layer 1, in which the peeling layer 28 is formed, is separated at the separating regions 44 in the direction of thickness of the base body layer 1. Doing so forms a die D having at least a portion of the NMOS transistor 47 and the PMOS transistor 46, which are the elements. That is, after the removal of the photoresist 32, a resist or the like is coated form a surface protecting film 33. Thereafter, as illustrated in FIG. 23, the base body layer 1 is separated in the separating regions 44 by dicing to form a plurality of dies D.

Note that the photoresist 32 from the time when the grooves 52 were formed may be used, as is, as the surface protecting film. However, from the perspective of forming the side surfaces of the dies D into smooth surfaces, it is preferable to form the surface protecting film 33 separate from the photoresist 32, as described above.

(Step for Bonding)

Figure 24:
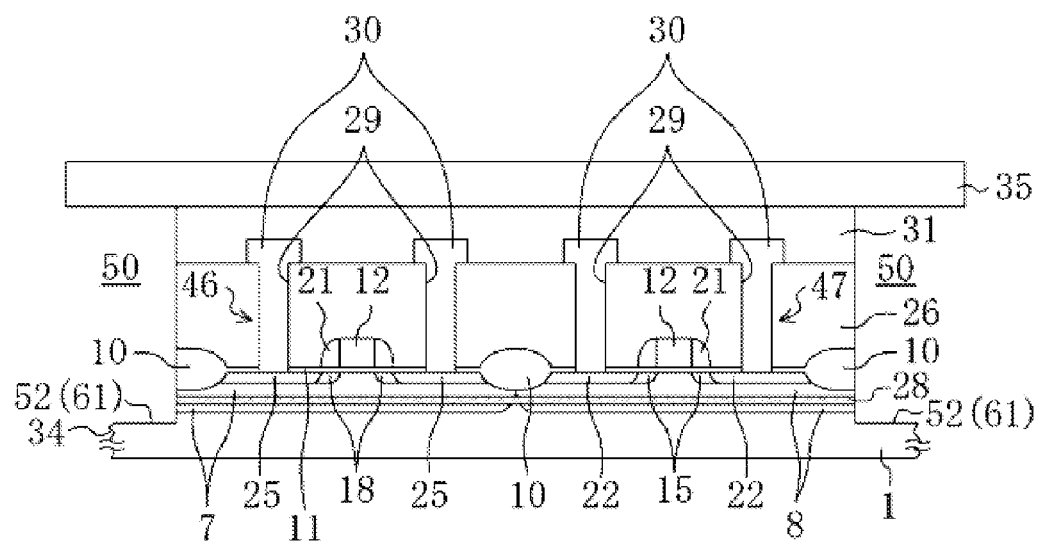
FIG. 24 is a cross-sectional diagram showing a die that is bonded to a glass substrate.

A step for bonding is performed next. In the bonding step, the die D is bonded to the substrate 35 at the surface of the planarizing film 31. A glass substrate 35, for example, is used for the substrate 35. That is, after the surface protecting film 33 is removed, the surface of the planarizing film 31 is subjected to SC 1 cleaning to remove organics from the surface, and to terminate hydroxide bases. Thereafter, as illustrated in FIG. 24, a similarly SC 1-cleaned glass substrate 35 is positioned to perform self-bonding through van der Waals force to bond to the surface of the planarizing film 31.

(Step for Peeling)

Figure 25:
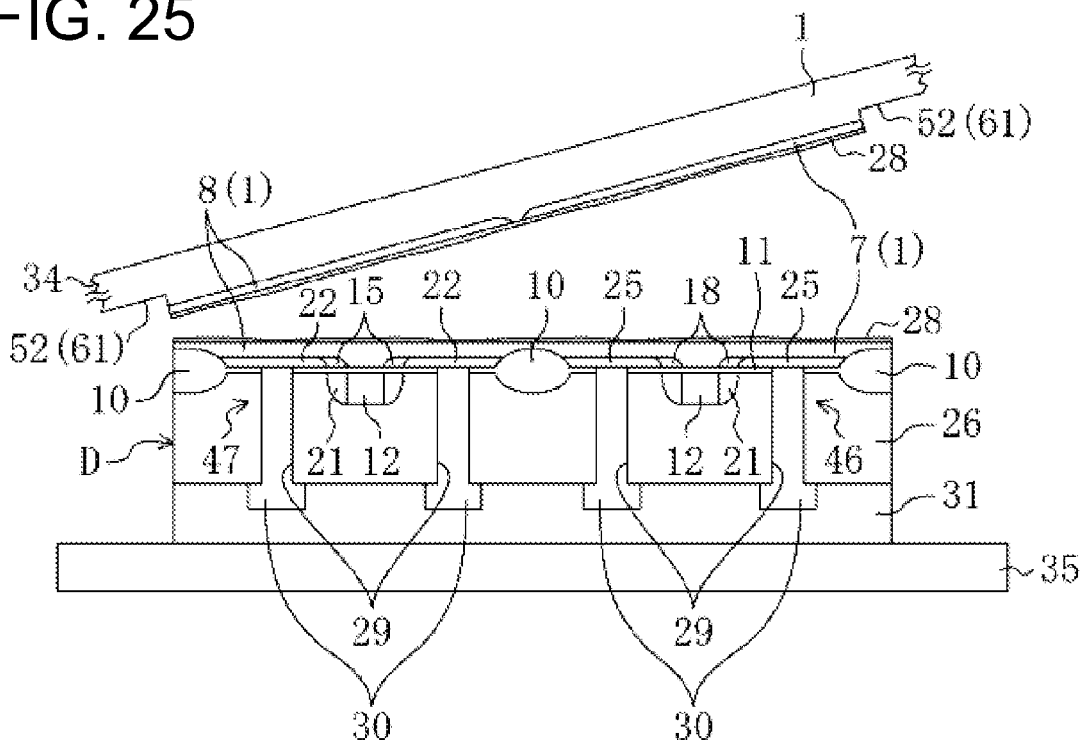
FIG. 25 is a cross-sectional diagram showing a die in which a portion of the silicon substrate has been separated along the peeling layer.

A step for peeling is performed next. In the peeling step, a portion of the base body layer 1 in the die D that is bonded to the glass substrate 35 is peeled and removed along the peeling layer 28. As illustrated in FIG. 25, a portion of the silicon substrate 1 (the base body layer 1) (that is, the portion that is on the opposite side of the gate electrode 12 with respect to the peeling layer 28) is peeled and removed along the peeling layer 28 by performing a heat treatment at about 400 to about 600° C. to transfer the NMOS transistor 47 and the PMOS transistor 46 to the glass substrate 35.

(Step for Element Separation)

Thereafter, as illustrated in FIG. 4, after removing the peeling layer 28 through etching or the like, the base body layer 1 (the n-well region 7 and the p-well region 8) is thinned through etching, CMP, or the like until the LOCOS oxide film 10 is exposed to perform element separation. Moreover, as illustrated in FIG. 4, a protecting film 36 is formed in order to protect the exposed surface of the base body layer 1 and to ensure electrical insulation. The semiconductor device S is manufactured as set forth above.

Effects of the Present Embodiment

Figure 26:
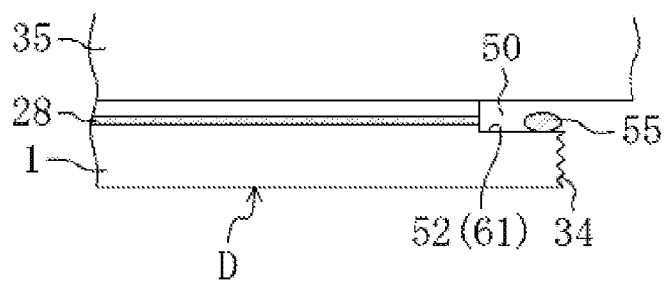
FIG. 26 is an expanded cross-sectional diagram showing a gap between the glass substrate and the die.

Thus, according to the present embodiment, grooves 52 that include at least a portion of the separating region 44 in the bottom surfaces 61 thereof are formed in advance of the formation of the die D, in which the formation of the grooves 52 form the exterior shape of the die D into an octagon, as a polygon in which all interior angles are obtuse, and thus it is possible to form, in at least a portion of the side surfaces of the die D, a cutout portion including an interior surface and the bottom surface 61 of the groove 52. Thus, even if dust were to adhere to the cutout portion of the die D, a prescribed gap 50 exists between the bottom surface 61 of the cutout portion and the glass substrate 35, as illustrated in FIG. 26, which is an enlarged view, such that the dust 55 in the gap 50 would not become pinched between the die D and the glass substrate 35. The result is that the bonding of the die D and the glass substrate 35 will not be obstructed by the dust 55 in the outer peripheral region of the die D, making it possible to increase the bonding accuracy thereof. In addition to this, the exterior shape of the die D is shaped into an octagon, in which all of the interior angles are obtuse, so that none of the interior angles will be less than 90°, thus making it possible to obtain an adequately strong bonding force with the glass substrate 35 around the entire periphery of the die D, including the corner portions of the die D. The result is the ability to increase greatly the precision of the shape of the die D that is bonded onto the glass substrate 35.

Figure 27:
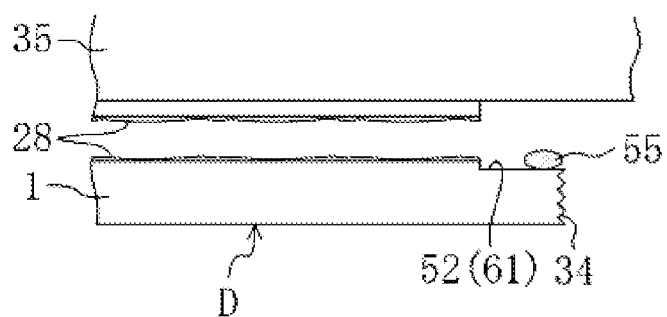
FIG. 27 is an expanded cross-sectional diagram showing a state in which a portion of the silicon substrate has been peeled off.

Furthermore, because the grooves 52 are formed so as to be deeper than the depth of the hydrogen implantation, the dust 55 that is adhered to the edge portions of the die D will not remain on the glass substrate 35 at the peeling step, as illustrated in FIG. 27, which is an enlarged view.

Furthermore, because the side surfaces of the die D are formed by the side surfaces of the grooves 52 that are formed by photolithography and etching, they can be formed in smooth planar shapes. Consequently, the side surfaces of the die D can be formed into planar shapes with excellent accuracy, thus making it possible to increase easily the accuracy of positioning itself in the bonding, eliminating the need to increase the size of the bonding margins. This can also increase the yield of the manufactured semiconductor devices, and increase the degree of integration thereof.

Figure 32:
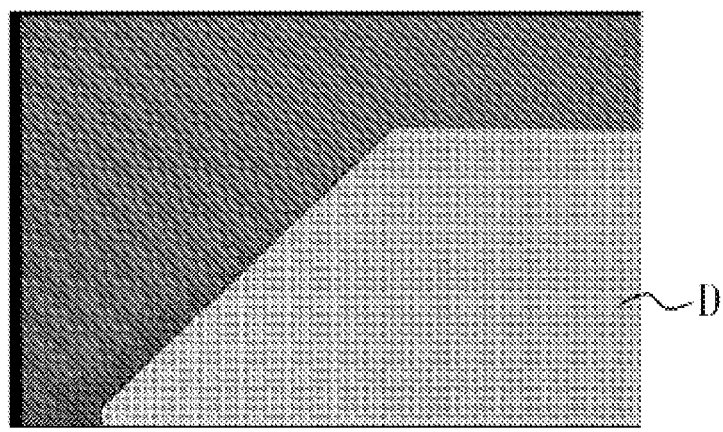
FIG. 32 is a photograph corresponding to a plan view showing a corner portion of a die according to an embodiment of the present invention that was actually manufactured.
Figure 33:
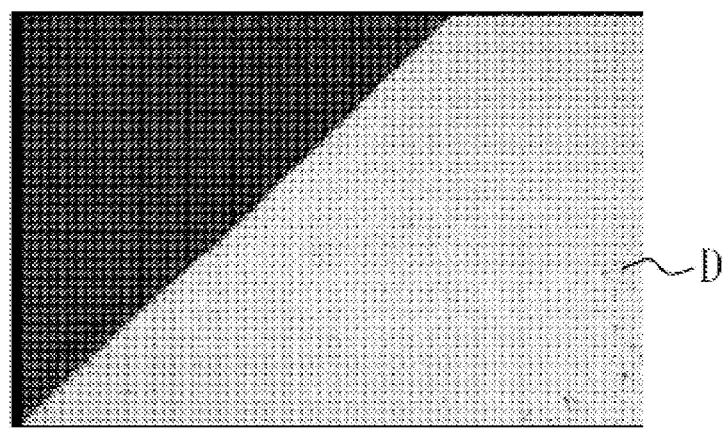
FIG. 33 is a photograph showing, with greater magnification, the corner portion of the die in FIG. 32.
Figure 37:
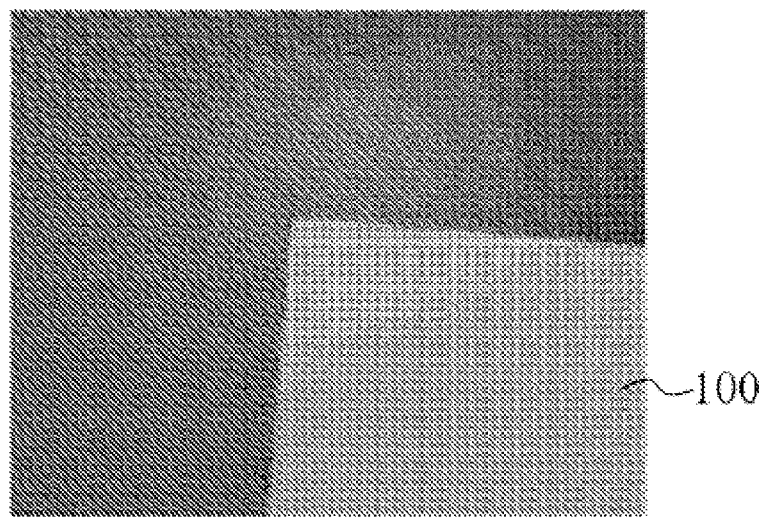
FIG. 37 is a photograph corresponding to a plan view showing a corner portion of a conventional die.
Figure 38:
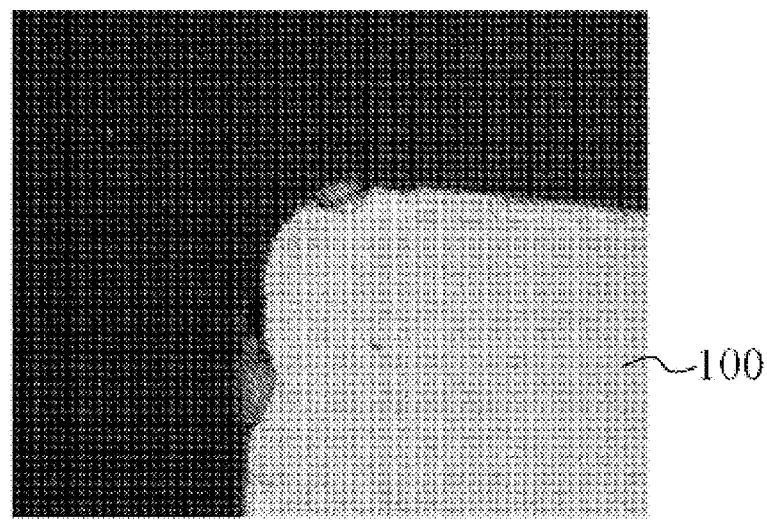
FIG. 38 is a photograph in which the corner portion of the die in FIG. 37 is enlarged further.

Here the results of observations of die D for semiconductor device S that has actually been manufactured are provided in FIG. 32 and FIG. 33. FIG. 32 and FIG. 33 are photographs of observations at the same magnification as in FIG. 37 and FIG. 38, respectively, which illustrate a conventional die. As illustrated in FIG. 37 and FIG. 38, it was confirmed that excellent precision was maintained in the linear shapes in the exterior shape of the die D, and that the precision of the shapes of the die D was increased greatly in the present embodiment.

Other Embodiments

While in the embodiment set forth above, the explanation was for a case in which the die D, when viewed from the direction of thickness of the glass substrate 35 or of the base body layer 1, was a polygon, as an alternative embodiment, the exterior shape of the die D, when viewed from the direction of thickness of the glass substrate 35 or the base body layer 1, may be formed with arc-shaped portions 60 so as not to form interior angles.

Figure 34:
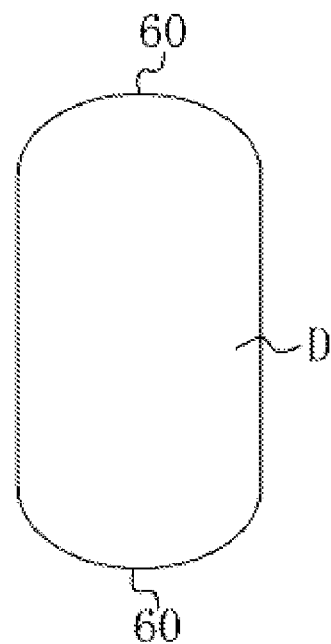
FIG. 34 is a plan view showing the exterior shape of a die according to another embodiment.

For example, as illustrated in FIG. 34, which is a plan view, the exterior shape of the die D may be formed into an ovoid shape including a pair of parallel line portions and arc-shaped portions 60 that link together these line portions and that protrude to the outside. Moreover, the exterior shape of the die D may instead be circular, as illustrated in the plan view in FIG. 35. Furthermore, as illustrated in the plan view in FIG. 36, the exterior shape of the die D may be a shape in which the corners of a rectangle are R-chamfered.

In this case, in the groove forming step set forth above, arc-shaped portions 60 are formed so that the exterior shape of the die D, when viewed from the direction of thickness of the base body layer 1, will not form interior angles, by forming grooves 52 through photolithography.

Figure 35:
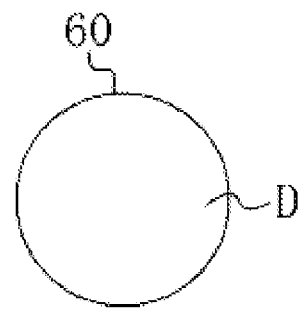
FIG. 35 is a plan view showing the exterior shape of a die according to another embodiment.
Figure 36:
FIG. 36 is a plan view showing the exterior shape of a die according to another embodiment.

Even with the shapes illustrated in FIGS. 34 and 35, no interior angles of less than 90° are formed in the exterior shape of the die D, and thus it is possible to obtain adequate adhesive strength with the glass substrate 35 around the entire periphery of the die D. The result is the ability to increase greatly the precision of the shape of the die D that is bonded to the glass substrate 35, in the same manner as in the embodiment described above.

INDUSTRIAL APPLICABILITY

As described above, the present invention is useful in a semiconductor device used in, for example, a liquid crystal display device or the like, and in the manufacturing method thereof.

DESCRIPTION OF REFERENCE CHARACTERS

S semiconductor device
D die
1 base body layer, silicon substrate
26, 31 planarizing films
27 substance for peeling
28 peeling layer
35 glass substrate (substrate)
44 separating region
46, 47 MOS transistors (elements)
52 groove
60 arc-shaped portion
61 bottom surface

The invention claimed is:

1. A method for manufacturing a semiconductor device comprising:
    forming at least a portion of an element in a base body layer;
    forming a peeling layer through ion implantation of a substance for peeling into the base body layer;
    forming a planarizing film having a planar surface so as to cover said at least the portion of the element;
    separating the base body layer in which the peeling layer has been formed in the direction of thickness of the base body layer in a prescribed separating region to form a die having said at least the portion of the element;
    bonding said die onto a substrate at a surface of said planarizing film;
    peeling and removing a portion of the base body layer in the die that has been bonded to the substrate along the peeling layer; and
    prior to the formation of said die, forming a groove, open to the surface of the planarizing film, so as to include at least a portion of the separating region in a bottom surface of the groove,
    wherein in the step of forming the groove, an external shape of the die is shaped as a polygon in which all internal angles are obtuse, when viewed from a direction of thickness of the base body layer.

2. The method for manufacturing a semiconductor device according to claim 1, wherein the groove has the bottom surface that is further on an opposite side of the planarizing film than the peeling layer.

3. The method for manufacturing a semiconductor device according to claim 1, wherein the substrate is a glass substrate.

4. The method for manufacturing a semiconductor device according to claim 1, wherein the base body layer is one of a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a LiNbO₃ layer, a LaAlO₃ layer, and a SrTiO₃ layer.

5. The method for manufacturing a semiconductor device according to claim 1, wherein the substance for peeling is at least one of hydrogen and an inactive element.

6. The method for manufacturing a semiconductor device according to claim 1,
wherein the groove has the bottom surface that is further on an opposite side of the planarizing film than the peeling layer,
wherein the substrate is a glass substrate,
wherein the base body layer is one of a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a LiNbO₃ layer, a LaAlO₃ layer, and a SrTiO₃ layer, and
wherein the substance for peeling is at least one of hydrogen and an inactive element.

7. A method for manufacturing a semiconductor device, comprising:
forming at least a portion of an element in a base body layer;
forming a peeling layer through ion implantation of a substance for peeling into the base body layer;
forming a planarizing film having a planar surface so as to cover said at least the portion of the element;
separating the base body layer in which the peeling layer has been formed in the direction of thickness of the base body layer in a prescribed separating region to form a die having said at least the portion of the element;
bonding said die onto a substrate at a surface of the planarizing film;
peeling and removing a portion of the base body layer in the die that has been bonded to the substrate along the peeling layer; and
prior to the formation of said die, forming a groove, open to the surface of the planarizing film, so as to include at least a portion of the separating region in a bottom surface of the groove,
wherein arc-shaped portions are formed at the exterior shape of the die through the formation of the grooves so that no interior angles are formed, when viewed from the direction of thickness of the base body layer.

8. The method for manufacturing a semiconductor device according to claim 7, wherein the groove has the bottom surface that is further on an opposite side of the planarizing film than the peeling layer.

9. The method for manufacturing a semiconductor device according to claim 7, wherein the substrate is a glass substrate.

10. The method for manufacturing a semiconductor device according to claim 7, wherein the base body layer is one of a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a LiNbO₃ layer, a LaAlO₃ layer, and a SrTiO₃ layer.

11. The method for manufacturing a semiconductor device according to claim 7, wherein the substance for peeling is at least one of hydrogen and an inactive element.

12. The method for manufacturing a semiconductor device according to claim 7,
wherein the groove has the bottom surface that is further on an opposite side of the planarizing film than the peeling layer,
wherein the substrate is a glass substrate,
wherein the base body layer is one of a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a LiNbO₃ layer, a LaAlO₃ layer, and a SrTiO₃ layer, and
wherein the substance for peeling is at least one of hydrogen and an inactive element.

13. A semiconductor device comprising:
a die having at least a portion of an element formed in at least a portion of a base body layer, said element being covered with a planarizing film having a substantially flat top surface; and
a substrate to which the die is bonded upside down with the planarizing film interposed therebetween, the top surface of the planarizing film being affixed to a surface of the substrate such that a substantially entire top surface of the planarizing film is physically attached to a surface of the substrate,
wherein an exterior shape of said die forms a polygon in which all the interior angles are obtuse, when viewed from a direction of thickness of the substrate.

14. The semiconductor device according to claim 13, wherein an outside surface of the die is formed in a planar shape by photolithography and etching.

15. The semiconductor device according to claim 13, wherein the substrate is a glass substrate.

16. The semiconductor device according to claim 13,
wherein the substrate is a glass substrate, and
wherein the base body layer is one of a silicon layer, a germanium layer, a group II-VI compound semiconductor layer or a mixed crystal layer thereof, a group III-V compound semiconductor layer or a mixed crystal layer thereof, a group IV-IV compound semiconductor layer or a mixed crystal layer thereof, a LiNbO₃ layer, a LaAlO₃ layer, and a SrTiO₃ layer.

17. A semiconductor device comprising:
a die having at least a portion of an element formed in at least a portion of a base body layer, said element being covered with a planarizing film having a substantially flat top surface; and
a substrate to which said die is bonded upside down with the planarizing film interposed therebetween, the top surface of the planarizing film being affixed to a surface of the substrate such that a substantially entire top surface of the planarizing film is physically attached to a surface of the substrate,
wherein arc-shaped portions are formed at an exterior shape of said die so that no interior angles are formed, when viewed from a direction of thickness of the base body layer.

18. The semiconductor device according to claim 17,
wherein the substrate is a glass substrate, and
wherein the base body layer is one of a silicon layer, a germanium layer, a group II-VI compound semiconductor layer or a mixed crystal layer thereof, a group III-V compound semiconductor layer or a mixed crystal layer thereof, a group Iv-Iv compound semiconductor layer or a mixed crystal layer thereof, a LiNbO₃ layer, a LaAlO₃ layer, and a SrTiO₃ layer.

* * * * *